United States Patent [19]

Nakagawa et al.

[11] Patent Number: 4,751,469
[45] Date of Patent: Jun. 14, 1988

[54] PHASE COINCIDENCE DETECTOR

[75] Inventors: Junichi Nakagawa, Tokorozawa; Hidefumi Kimura, Katsuta; Yoshitomo Kuwamoto, Yokosuka; Masanori Ienaka, Takasaki; Hideaki Watanabe, Katsuta, all of Japan

[73] Assignees: Hitachi Ltd.; Hitachi Video Eng. Inc., both of Tokyo, Japan

[21] Appl. No.: 52,968

[22] Filed: May 22, 1987

[30] Foreign Application Priority Data

May 23, 1986 [JP] Japan .................. 61-117383

[51] Int. Cl.[4] .............................. H03K 9/08
[52] U.S. Cl. .................. 328/133; 307/510; 328/110
[58] Field of Search ............ 328/110, 133, 134, 155; 307/510, 511, 234

[56] References Cited

U.S. PATENT DOCUMENTS 3,610,954 10/1971 Treadway ............. 328/133 X
4,122,405 10/1978 Tietz et al. ........... 307/511 X
4,354,124 10/1982 Shima et al. .......... 328/133 X

FOREIGN PATENT DOCUMENTS 0145928 7/1986 Japan .................. 307/510

Primary Examiner—Eugene R. Laroche
Assistant Examiner—Seung Ham
Attorney, Agent, or Firm—Antonelli, Terry & Wands

[57] ABSTRACT

This invention relates to a phase coincidence detector for examining whether or not two input digital signals are coincident by utilizing a delay signal and an advance signal of a digital phase comparator which examines the phase difference between the two input digital signals and outputs the delay signal representing the delay of one of the input signals to the other and the advance signal representing the advance of one of the input signals to the other. Particularly, the output signals of the phase comparator, that is, the delay signal and the advance signal, are periodic pulse signals, and residual pulses having a small pulse width occur periodically even at the time of coincidence. The phase coincidence detector of this invention changes the delay and advance signals by a pulse width discrimination circuit for discriminating whether or not the phase difference between the two input signals is below a certain constant value, and samples the changed signals to output the in-phase and out-of-phase state as signals having different levels.

6 Claims, 7 Drawing Sheets

30
PHASE COMPARATOR

9'
SAMPLING CKT

PHASE COINCIDENCE DETECTOR

BACKGROUND OF THE INVENTION (1) Field of the Invention

This invention relates to a phase coincidence detector for generating a phase coincidence signal representing whether or not the phases of two signals are coincident, and more particularly to a phase coincidence detector suitable for a phase-locked loop (PLL) using a digital frequency/phase comparator.

(2) Description of the Prior Art

A phase comparator with a function of a frequency discriminator will be herein referred to as a "frequency/phase comparator" and simply the "phase comparator" unless specified otherwise. The phase coincidence signals obtained easily from these phase comparators in accordance with the prior art involve the problem in that they become pulsive signals as will be explained below.

Figure 2:
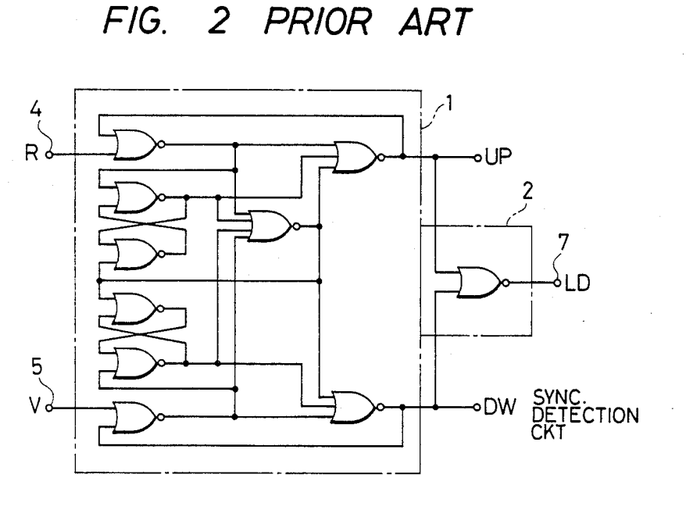
FIG. 2 is a circuit diagram of a conventional phase coincidence detector.

FIG. 2 of the accompanying drawings shows a phase comparator 1 and a phase coincidence detector 2 employed in RCA CMOS Integrated Circuit CD4046A (RCA, Application Note ICAN-6101). The phase comparator 1 consists of nine NOR gates as shown in the drawing, and outputs a delay signal UP (a signal indicating that the phase of a signal V lags behind the phase of a signal R) from a terminal UP in accordance with the phase difference between the digital signal R inputted to a terminal 4 and the digital signal V inputted to a terminal 5 and an advance signal DW (a signal indicating that the phase of the signal V advances with respect to the phase of the signal R) from the terminal DW. The phase coincidence detector 2 outputs the NOR logic output between the delay signal UP and the advance signal DW as a signal LD representing the coincidence state from a terminal 7 (hereinafter referred to as the "coincidence signal").

Figure 3:
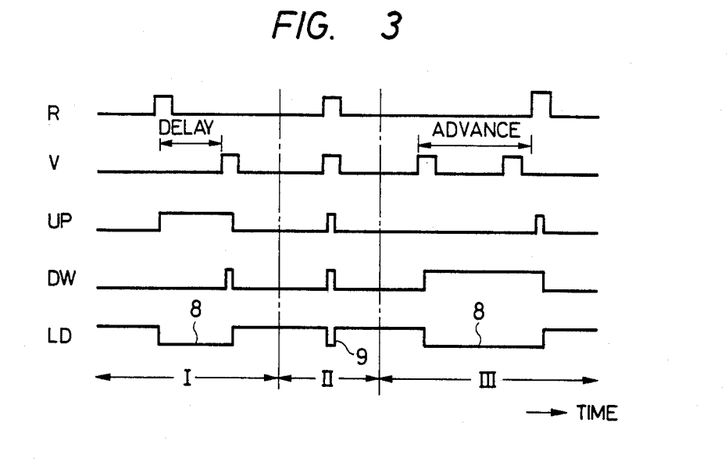
FIG. 3 is a time chart useful for explaining the operation of the circuit shown in FIG. 2.

FIG. 3 shows examples of operating waveforms of the circuit shown in FIG. 2. A time region I represents the case where the phase of the signal V delays with respect to the signal R. The delay signal UP is at the "high" level for a period corresponding to the phase difference of both signals while the advance signal DW becomes a residual pulse having a small pulse, width. A time region II represents the case where the phases of the signals R and V are coincident, and both the signals UP and DW become residual pulses having a small pulse width. A time region III represents the case where the phase of the signal V advances with respect to the signal R. The advance signal becomes the high level for a period corresponding to the phase difference of both signals while the delay signal becomes a residual pulse having a small pulse width.

Incidentally, FIG. 3 shows one period for each of the time regions I, II and III for the sake of simple description, and the waveforms of these regions occur repeatedly in practice. The residual pulses appearing in the signals UP and DW are inevitable because the logic gates constituting the phase comparator have a delay time.

Therefore, the coincidence signal LD as the NOR signal between the signal UP and the signal DW exhibits a waveform wherein a negative pulses 8 having a pulse width corresponding to the phase difference between the signals R and V or negative residual pulses 9 occurs according to phase relations between the signals R and V. Therefore, the prior art involves the problem in that it cannot discriminate whether or not the phases are coincident only from a level at any instantaneous time.

When a phase-locked loop is constituted by use of the phase comparator 1 shown in FIG. 2, the phase of the signals R and V become substantially the same if the loop is in a locked state. However, the coincidence signal LD outputted from the phase coincidence detector 2 becomes a periodic signal consisting of the residual pulse 9 shown in FIG. 3 or a pulse having a somewhat greater pulse width than the width of the residual 9 shown corresponding to the residual phase difference between the signal R and the signal V. On the other hand, when the loop is out of coincidence, the phase relationship between the signals R and V changes at random so that the coincidence signal LD becomes a signal having a random pulse width. The pulsive coincidence signal LD should be integrated by analog circuits or softwares in order that other circuits for example, a logic controller or a microprocessor may monitor whether or not the phase-locked loop is in a locked state. However, there is the problem that the selection range of the charging time constant and the discharging time constant for the integration is small because the coincidence signal LD consists of pulses having a random pulse width.

SUMMARY OF THE INVENTION

In a phase comparator which compares the phase of one of the input digital signals with that of the other and generates signals representing the delay and advance of one of the digital signals with respect to the other, it is a main object of the present invention to provide a phase coincidence detector capable of generating a phase coincidence signal, which represents whether or not the instantaneous phases of both the input signals are coincident and which is not pulsive, and capable of holding the phase coincidence signal at a predetermined level for a certain period of time.

The phase coincidence detector in accordance with the present invention is characterized in that it has phase comparison characteristics such that it has a dead zone where the output pulse width becomes zero when the input signal phase difference is below a certain predetermined value $T_D$, and that it outputs a levelized phase coincidence signal in accordance with the difference between the input signal phase difference and the $T_D$ value by sampling the comparison outputs.

These and other objects and novel features of the present invention will become more apparent from the following description when taken in conjunction with the accompanying drawings.

DESCRIPTION OF THE PREFERRED EMBODIMENTS

Figure 1:
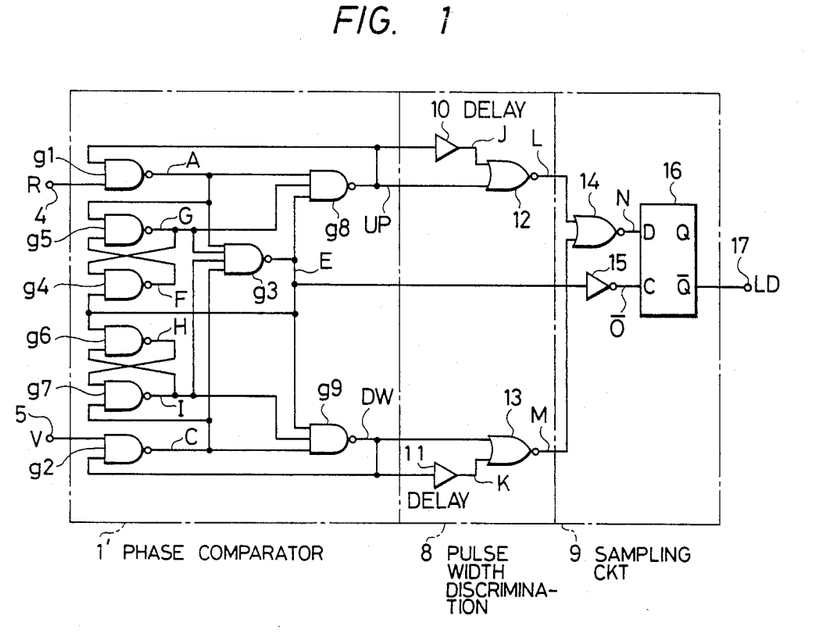
FIGS. 1, 5, 6, 8, 10, 12 and 13 are circuit diagrams of the phase coincidence detectors in accordance with the present invention.

FIG. 1 shows the construction of the phase coincidence detector in accordance with a first embodiment of the present invention. A phase comparator 1' consists of complementary logic gates in the same way as in the phase comparator 1 shown in FIG. 2. Output signals of nine NAND gates $g_1$ through $g_9$ will be hereby called "A, C, E, F, G, H, I, UP and DW", respectively, as shown in the drawing. The phase comparator 1' outputs a delay signal UP and an advance signal DW from the NAND gates $g_8$ and $g_9$, respectively, in accordance with the phase relationship between input signals R and V inputted to the terminals 4 and 5, and supplies them to a pulse width discriminator 8. The discriminator 8 supplies in turn the new delay signal L and advance signal M after pulse width discrimination to a sampling circuit 9. The pulse width discriminator 8 consists of two pulse width discrimination circuits each consisting of a delay element 10, 11 having a delay time $T_1$ and an NOR gate 12, 13. The signal UP is applied to the first input terminal of the NOR gate 12 and to the delay element 10, while the output signal J of the delay element 10 is applied to the second input terminal of the gate 12. The output of the gate 12 is the new delay signal L. Similarly, the signal DW is discriminated by the delay element 11 and the NOR gate 13 and the output signal from the latter is the new advance signal M. The sampling circuit 9 consists of an NOR gate 14 (output signal N) receiving the signals L and M as its input signals, a delay invertor 15 (output signal $\overline{O}$) receiving the signal E as its input signal and having a delay time $T_2$ and a D-type flip-flop 16 receiving the signals N and $\overline{O}$ at its D and C terminals. The $\overline{Q}$ terminal output signal of this flip-flop 16 is outputted from the terminal 17 as the phase coincidence signal LD. As will be described later, the discrimination characteristics of the output signals L, M with respect to the phase difference between the input signals R, V include a dead zone due to the combination of the phase comparator 1' and the pulse discriminator 8 and both of these circuits together constitute a phase comparator having a dead zone.

Figure 4A:
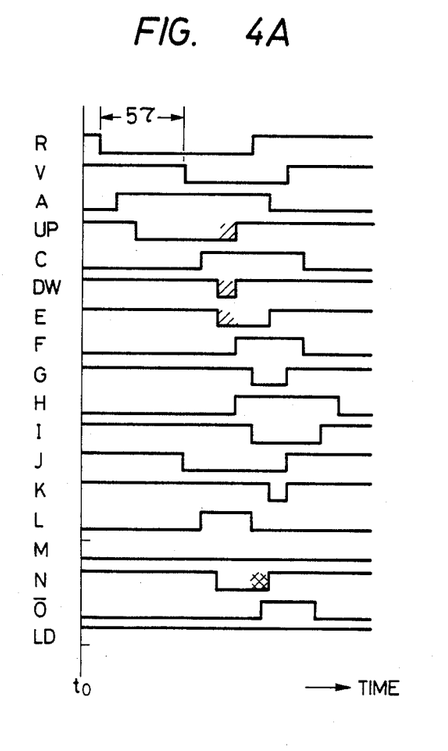
FIGS. 4, 7, 9, 11 and 14 are time charts useful for explaining the operation of the circuits shown in FIGS. 1, 6, 8, 10 and 13, respectively.
Figure 4B:
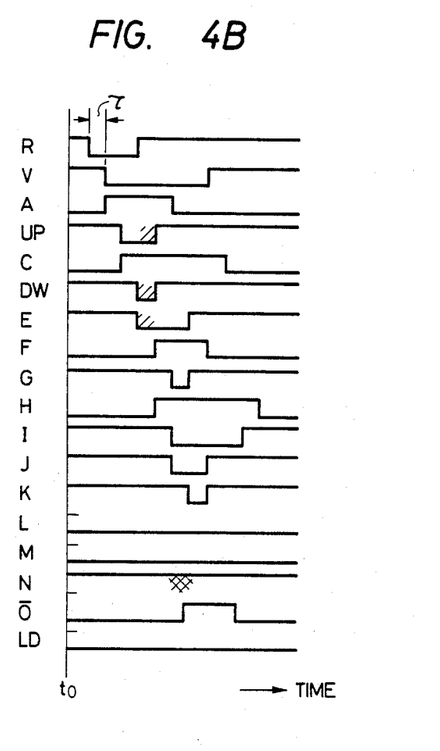

The operation of this embodiment will be described. The timing at which the signal N inputted to the D terminal of the flip-flop 16 is sampled by the input signal $\overline{O}$ at the C terminal is hereby important. Therefore, FIGS. 4A and 4B show in detail the operating waveforms including those of the phase comparator. It will be hereby assumed that in FIG. 1, the propagation delay time of each logic circuit exclusive of the delay element 10, 11 and the delay invertor 15 is all $\tau$. FIG. 4A shows the case where the falling edge of the signal V delays by 5 times of the propagation delay time $\tau$ relative to the falling edge of the signal R, while FIG. 4B shows the case where the phase difference is equal to the time $\tau$. The delay time $T_1$ of the delay elements 10 and 11 is selected to be thrice the propagation delay time $\tau$ while the delay time $T_2$ of the delay invertor 15 is selected to be 2.5 $\tau$.

Hereinafter, the operation of this embodiment will be explained with reference to the waveforms shown in FIGS. 4A and 4B. When the signal R falls, the signal A rises so that the signal UP falls. Next, when the signal V falls, the signal C rises and then the signals DW and E fall. When the signal E falls, the signals UP and DW rise to the original level and the signals F and H rise. When the signal F and H rise, the signal G and I fall. When either one of the signals R and UP, which is slower, rises (when R rises in FIG. 4A and when UP rises in FIG. 4B), the signal A falls to the original level and then the signal G rises to the original level. When either one of the signals V and DW, which is slower, rises (when V rises in both FIGS. 4A and 4B), the signal C falls to the original level and then the signal I rises to the original level. When the faster of the signals A, C, G and H falls (the signals G and I in FIG. 4A and the signals A, G and I in FIG. 4B), the signal E rises to the original level. When the slower of the signals E and G rises (the signal G in FIG. 4A and the signals G and E in FIG. 4B), the signal F falls to the original level. When the slower of the signals E and I rises (when the signal I rises in both FIGS. 4A and 4B), the signal H falls to the original level. In this manner a series of phase comparison operations are complete.

In the pulse width discriminator 8, the leading part of the pulse is cut off from the negative pulse of each signal UP, DW by the propagation delay time $T_1 = 3 \tau$ of the delay element 10, 11. In other words, if the falling edge phase difference between the signals R and V is $T_\theta$, the negative pulse width $T_p$ of the signal L or M is given by the following equation (1):

$$T_p = |T_\theta| + \tau - T_1 \tag{1}$$

If $T_1$ and $\tau$ are selected so as to satisfy the relation $T_1 \geq \tau$, one of the signals L and M (the signal M in the case of FIGS. 4A and 4B) remains always at the low level. In the case of $T_p \leq 0$, on the other hand, or in the case of FIG. 4B, both signals are kept at the low level. As is obvious from the description given above, in a range of the following equation:

$$|T_\theta| \leq T_1 - \tau \tag{2}$$

the pulse corresponding to the phase difference between the signals R and V does not appear in the signals L and M. In other words, the output signals L and M exhibit the discrimination characteristics having the dead zone to the phase difference between the input signals R and V.

As represented by hatching lines in FIG. 4, the signal E is at the low level, at the portions where the signals UP and DW are simultaneously at the low level. The hatching portions of the signals UP and DW remain as the residual pulses even in the case where the phase difference $T_\theta$ of the signals is zero, and move to the double hatching portions of the signal N after the delay 2 $\tau$. If the D type flip-flop 16 is of such a type that transfers the D terminal signal to the terminal Q or $\overline{Q}$ at the rise of the terminal signal C, the propagation delay time $T_2$ of the inverter 15 must be selected so that the rise of the signal $\overline{O}$ generated by inversing and delaying the signal E by the inverter 15 is near the trailing end portion of the double hatching portion of the signal N. In FIG. 4, $T_2 = 2.5 \tau$ as described already. As a result, the $\overline{Q}$ output signal LD of the flip-flop 16 is at the High level when $|T_\theta| > T_1 - \tau$ and at the Low level when $|T_\theta| \leq T_1 - \tau$ from eq. (1). In other words, when the phase relationship between the signals R and V is steady, the coincidence signal LD is fixed at the High or Low level.

In the embodiment shown in FIG. 1, the delay elements 10 and 11 may be constituted by known technique such as by delay lines or delay gates. The delay inverter 15 may consist of the combination of the delay element and the inverter. If the flip-flop 16 is of such a type that the D determinal signal is transferred to the output terminal at the fall of the C terminal signal, the delay element inverter 15 may be replaced by the delay element. Where it is desired to obtain the coincidence signal LD of a complementary polarity, the Q output signal of the flip-flop 16 may be extracted. Where the complementary system shown in FIG. 2 is used in place of the phase comparator 1', the NOR gates 12 and 13 may be replaced by AND gates.

Another embodiment of the present invention will be described with reference to FIG. 5. In comparison with the embodiment shown in FIG. 1, this embodiment is the same except that the delay elements 18, 19 and 20 are additionally inserted in the phase comparator 1" as shown in the drawing. Assuming that the delay time of the delay element 18 is $T_3$, the fall of the delay signal E' of the signal E delays by the time $T_3$ so that the hatching portions of the signals UP and DW in FIG. 4 expands by the time $T_3$. In other words, when the phases of the signals R and V are coincident, the residual pulse width of the signals UP and DW expands by $T_3$ in comparison with the waveforms shown in FIG. 3 of the embodiment in FIG. 1. Therefore, the output signal pulse width of the gate 14 expands and the selection range of the delay time $T_2$ of the delay inverter 15 expands in consequence.

Next, the operation of the delay element 19, 20 will be explained. In order for the flip-flop 16 to operate normally, the pulse width of the C terminal input terminal must be greater than the minimum width inherent to the circuit. If this minimum width cannot be secured in the embodiment shown in FIG. 1, the signals G and I are delayed by inserting the delay elements 19 and 20 having delay time $T_4$ and $T_5$ (normally, $T_4=T_5\equiv T_6$) as in the embodiment shown in FIG. 5 so that the rise of the signal E in FIG. 4 is delayed by the time $T_6$ and the signal having a greater pulse width by the time $T_6$ can be supplied to the C terminal of the flip-flop 16. In this embodiment, eq. (1) can be modified to the following equation (3):

$$T_p=|T_\theta|+\tau+T_3-T_1 \quad (3)$$

Figure 5:
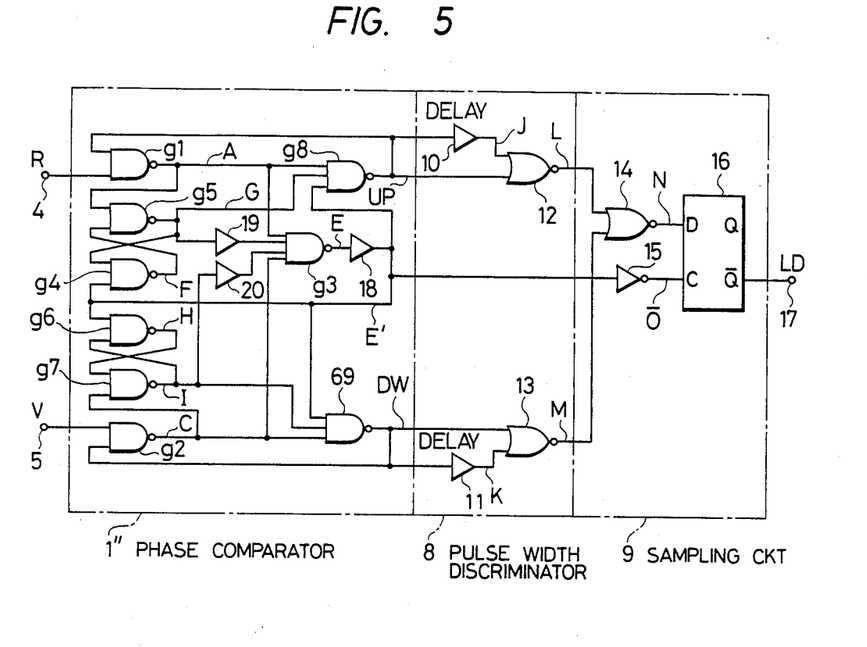
Figure 6:
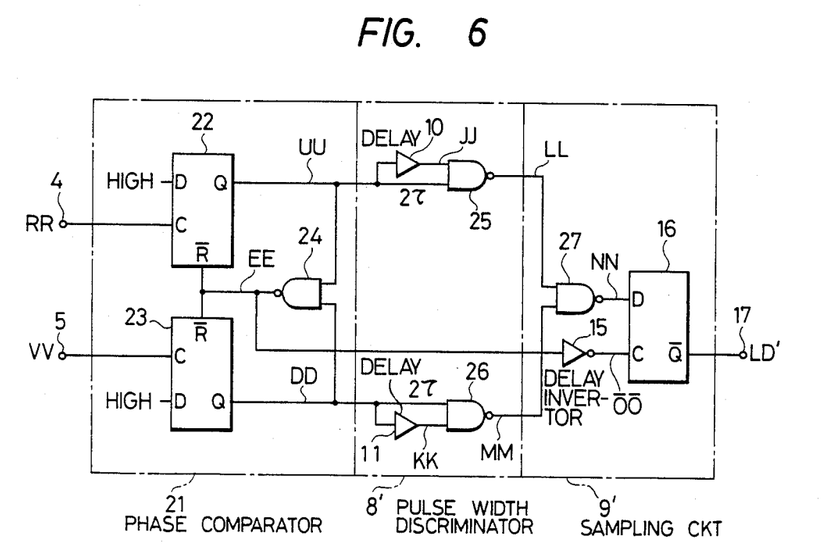
Figure 7:
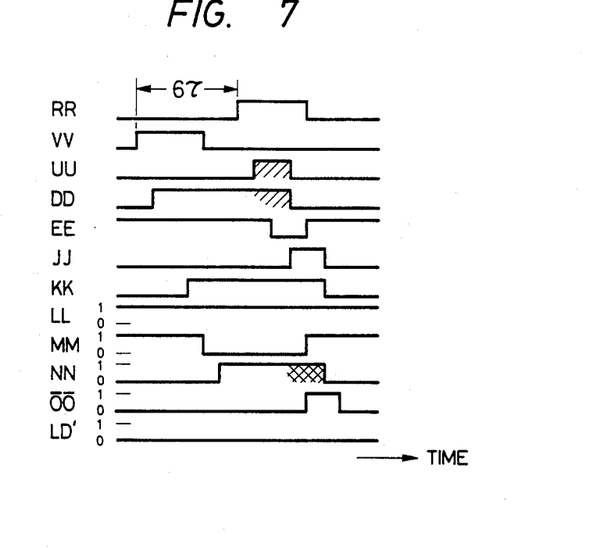

FIG. 6 shows the third embodiment which uses a phase comparator having a different principle of operation from the principle of the phase comparators used in FIGS. 1, 2 and 5. This phase comparator 21 consists of two D type flip-flops 22, 23 and a NAND gate 24. Each of the D type flop-flops 22, 23 is of a type which transfers the D terminal input signal to the output terminal Q at the rise of the C terminal input signal. It will be assumed that when the nagative pulse is inputted to its reset terminal $\overline{R}$, the output terminal Q is reset to the low level. Then, the high level is always applied to both D terminals. When the signals RR, VV rise from the low level to the high level, the signals UU and DD rise from the low level to the high level, respectively. When both the signals UU and DD attain the high level, the signal EE attains the low level and the flip-flops 22 and 23 are reset. Therefore, the signals UU and DD return to the low level. The hatching portions (width=$2\tau$) of the signal UU and DD in FIG. 7 represent the residual pulse portions that remain even when the rise phases of the signals RR and VV are coincident.

The principle of operation which provides sequentially the signals JJ, KK, LL and MM from the signals UU, DD is the same as that of the embodiment shown in FIG. 3. The hatching portions of the signals UU, DD move to the double hatching portion of the signal NN after the delay time $2\tau$. The signal EE is delayed by the inverter 15 so that the rise of the signal $\overline{OO}$ is positioned near the trailing edge of the double hatching portion. Assuming that the rising edge phase difference between the signals RR and VV is $T_\theta$, the positive pulse with $T_p$ of the signals LL, MM and NN is given by the following equation (4):

$$T_p=|T_\theta|+2\tau-T_1 \quad (4)$$

When $|T_\theta|>T_1-2\tau$, the coincidence signal LD' as the Q output of the flip-flop 16 changes to the low level, and when $|T_\theta|\leq T_1-2\tau$, it changes to the high level.

Both output terminals Q of the flip-flop circuits 22 and 23 are fed back to both reset terminals $\overline{R}$ through the NAND gate 24. Assuming that the Q output of the flip-flop 22, to which the signal RR is inputted, is the signal UU and the Q output of the flip-flop 23, to which the signal VV is inputted, is the signal DD, then the relationship of the signal VV to the signal RR is such that the signal UU is the delay signal and the signal DD is the advance signal. The pulse width discriminator 8' and the sampling circuit 9' are the same as those of the embodiment shown in FIG. 1 except that the NOR gates 12 through 14 of the embodiment shown in FIG. 1 are replaced by NAND gates 25 through 27, and the principle of their operation is the same, too.

The operation principle of the embodiment shown in FIG. 6 will be explained with reference to the operating waveforms shown in FIG. 7. It will be assumed that the output signals of the circuit elements 10, 11, 15, 24, 25, 26 and 27 are JJ, KK, OO, EE, LL, MM and NN, respectively. It will be assumed also for the sake of description that the delay time till the change of the Q output terminal after the change of the C terminals of the flip-flops 22, 23 and the change of the $\overline{R}$ terminal signals and the delay time of the gates 24 through 27 are all $\tau$, and that the delay time $T_1$ of the delay elements 10, 11 and the delay time $T_2$ of the delay inverter 15 are all $2\tau$. FIG. 7 shows the case where the rise of the signal VV advances by $6\tau$ with respect to the rise of the signal RR.

In the embodiment shown in FIG. 6, when the delay time of the gate 24 or the delay time from the $\overline{R}$ terminals of the flip-flops 22, 23 to the Q terminals is increased, the residual pulse portions in the signals UU and VV become greater and the negative pulse width of the signal EE becomes wider, too. As a result, the same effect of the delay elements 18, 19 and 20 in the embodiment shown in FIG. 5 can be expected.

Figure 8:
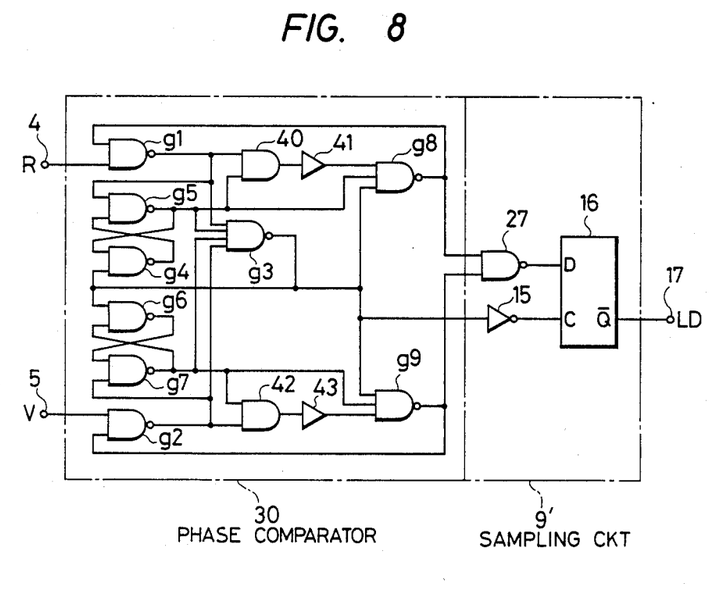

The fourth embodiment of the present invention will be described with reference to FIG. 8. In the embodiments shown in FIGS. 1, 5 and 6, the phase comparator exhibiting the input/output characteristics having the dead zone is constituted by the linear phase comparator and the pulse discriminator added to the post-stage of the former, but this embodiment uses a phase comparator having by itself the input/output characteristics having the dead zone. This phase comparator 30 consists of nine NAND gates $g_1$ through $g_9$, AND gates 40, 42 and delay elements 41, 43 having the delay time $T_1'$. In comparison with the phase comparator 1' of the embodiment shown in FIG. 1, the phase comparator of this embodiment includes additionally the AND gates 40, 42 and the delay elements 41, 43. The AND gate 40 obtains the logical product between the output signals of the gates g1 and g7 and inputs the logical product signal to the gate g8 through the delay element 41. Similarly, the output signal between the gates g2 and g7 is inputted to the gate g9 through the AND gate 42 and the delay element 43. The sampling circuit 9' has the same construction as that of the sampling circuit in the embodiment shown in FIG. 6. The output signal between the gates g8 and g9 is inputted to the NAND gate 27 and the output of the gate 35 is inputted to the delay inverter 15.

Figure 9A:
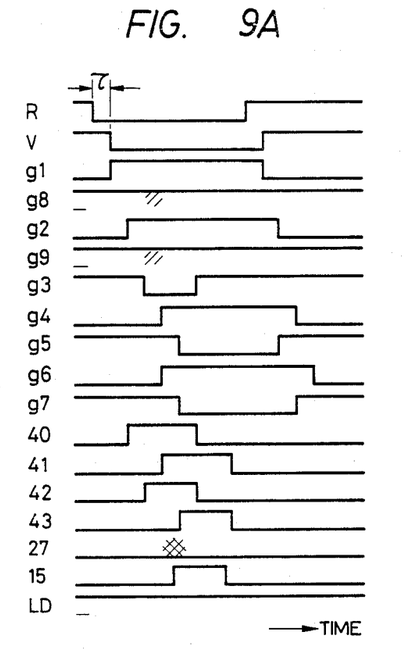
Figure 9B:
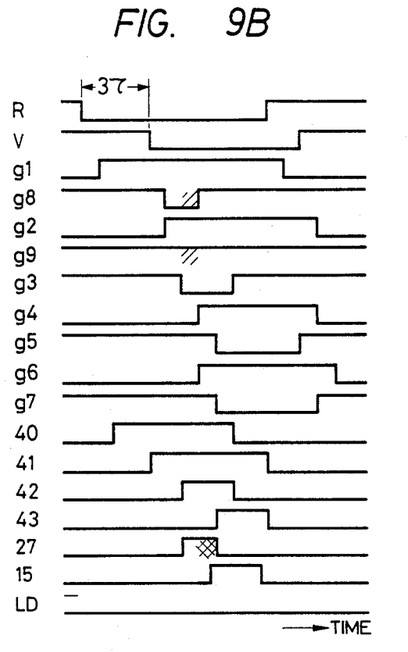

For the sake of description of the operation of this embodiment, the delay time of the NAND gates and the AND gates are assumed to be all $\tau$, and the reference numeral of each circuit element corresponds to the output signal of each circuit element. FIGS. 9A and 9B shows the operating waveforms of this embodiment. FIG. 9A shows the case where the falling edge of the signal V delays by the time $\tau$ to the falling edge of the signal R, while FIG. 9B shows the case where the phase difference is $3\tau$. Here, the delay time $T_1'$ of the delay elements 41, 43 and the delay time $T_2$ of the delay inverter 15 are selected to be $2\tau$ and $1.5\tau$, respectively. As described above, the phase comparator 30 is produced by adding some circuit elements to the phase comparator 1' of the embodiment shown in FIG. 1 as described already. Therefore, the principle of its fundamental operation is the same as that of the phase comparator 1', and only the portion having the different operation will be described.

The signal g1 rises due to the fall of the signal R but the time $T_1+\tau$ is necessary before this rise propagates to the gate g8. If the signals g3 and g5 are at the high level when the signal 41 rises, the signal g8 falls (FIG. 9B). If the signals g3 or g5 are at the low level when the signal 41 rises, the signal g8 remains at the high level (FIG. 9A). The operation of the signals g2 and g9 at the time of the fall of the signal V is the same. In FIG. 9B, when the signal g2 rises, the signal g3 falls to return the signal g8 to the high level. The signal g5 is applied to the gate 40 to cut off the trailing edge of the positive pulse of the signal g1 in order to prevent the signals g3, g5, 41 from attaining simultaneously the high level. The signal g7 is applied to the gate 42 for the same purpose.

If the falling edge phase difference between the signals R and V is $T_\theta$, the negative pulse width $T_p$ of g8 or g9 is given by eq. (1) with $T_1$ representing the total delay time of the gate 40 and the delay element 41. Therefore, the same discussion holds true as in the embodiment shown in FIG. 1 and the pulse corresponding to the phase difference between the signals R and V does not appear on g8 or g9 within the range of eq. (2). The hatching portions of g8 and g9 in FIG. 9 correspond to positions of the residual pulse that appears in the case of $T_\theta=0$ in the same way as in the other embodiments. This portion moves to the double hatching portion of the signal 27 after the delay $\tau$. This double hatching portion is sampled by the signal 15 to obtain the coincidence signal LD.

Figure 10:
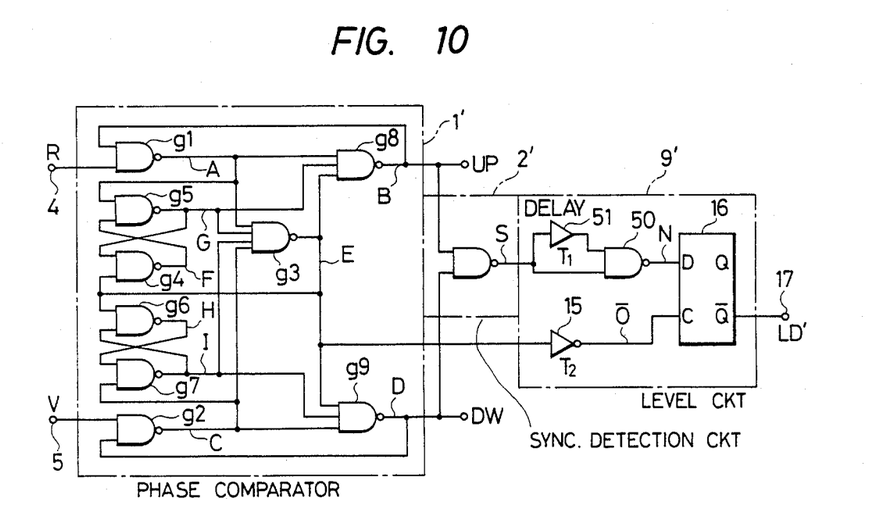

FIG. 10 shows a circuit diagram of still another embodiment of the present invention. In order to remove pulses below a predetermined pulse width, this embodiment obtains the logical product or logical sum between the pulsive phase coincidence signal and the signal obtained by delaying the former by a predetermined time. This also holds true of the following embodiments shown in FIGS. 12 and 13.

In FIG. 10, like reference numerals are used to identify like constituents as in FIG. 1 and the description of such constituents will be omitted. The phase coincidence detector 2' consists of a complementary logic gate with the phase coincidence detector 2 shown in FIG. 2. The levelizing circuit 9' for levelizing the pulsive coincidence signal from the coincidence detector 2' consists of a pulse discriminator consisting in turn of a delay element 51 having a delay time $T_1$ and a NAND gate 50, a delay inverter 15 having a delay time $T_2$ and a D type flip-flop 16 as a sampling circuit.

The NAND signal S between the signals B and D is inputted to the delay element 51 and the first input terminal of the NAND gate 22 and the output signal t of the delay element 51 is inputted to the second terminal of the NAND gate 50. The negative pulse width of the output signal N of the gate 50 is narrower by the delay time $T_1=3\tau$ than the positive pulse width of the signal S. In other words, the negative pulse width $T_p$ of the signal N is given by the following equation (1)' with $T_\theta$ representing the falling edge phase difference between the signals R and V:

$$T_p = |T_\theta| + \tau - T_1 \qquad (1)'$$

Figure 11A:
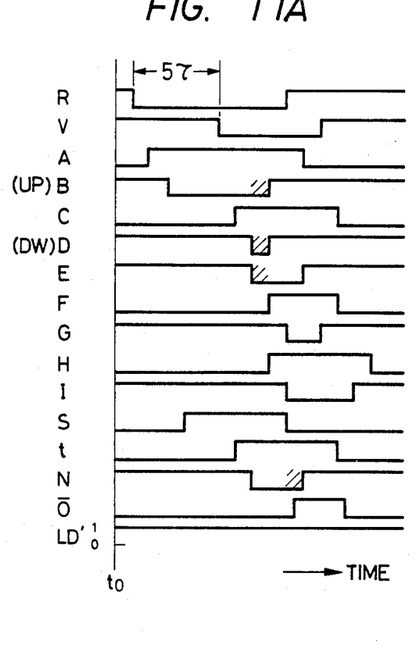
Figure 11B:
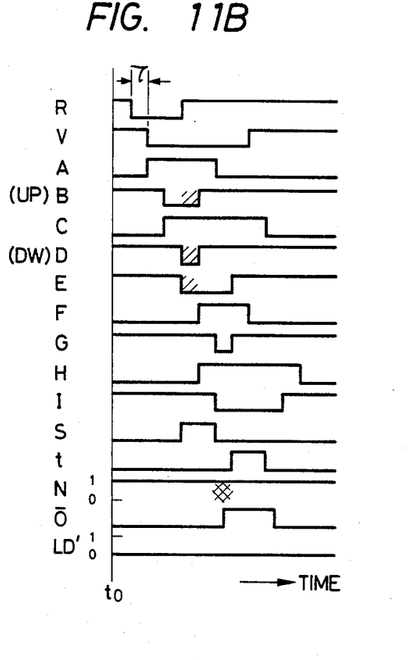

When $T_p \leq 0$, the signal N remains at the high level as shown in FIG. 11B. As represented by hatching portions in FIG. 11, the signal E is at the low level, at the portions where the signals B and D are simultaneously at the low level. The hatching portions of the signals B and D remain as the residual pulse when $T_\theta$ is zero, and the signal N moves to the double hatching portion. If the D type flip-flop 16 is of such a type that transfers the D terminal signal to the terminal Q or $\overline{Q}$ at the rise of the C terminal signal $\overline{O}$, the delay time $T_2$ of the inverter 15 must be selected so that the rise of the signal O obtained by inversing and delaying the signal E by the inverter 15 is positioned near the rear end of the double hatching portion. In FIG. 11, $T_2=2.5\tau$ as described already. As a result, the $\overline{Q}$ output signal LD' of the flip-flop 14 is at the high level when $|T_\theta > T_1 - \tau$ and at the low level when $|T_\theta| > T_1 - \tau$ from eq. (1). In other words, when the phase relationship between the signals R and V is steady, the coincidence signal LD' is a signal which is fixed to the high or low level.

In the embodiment shown in FIG. 10, the delay element 51 may be formed by the known technique such as a delay line and a delay gate. The delay inverter may consist of the delay element and the inverter. If the flip-flop 16 is of such a type that transfers the D terminal signal to the output terminal at the fall of the C terminal signal, the delay inverter 15 may be replaced by the delay element. Where it is desired to obtain the coincidence signal LD' having the complementary polarity, the Q output signal of the flip-flop 16 may be extracted. When the complementary system shown in FIG. 2 is used in place of the phase comparator 1' and the coincidence signal detector 2', the NAND gate 50 may be replaced by an NOR gate.

Figure 12:
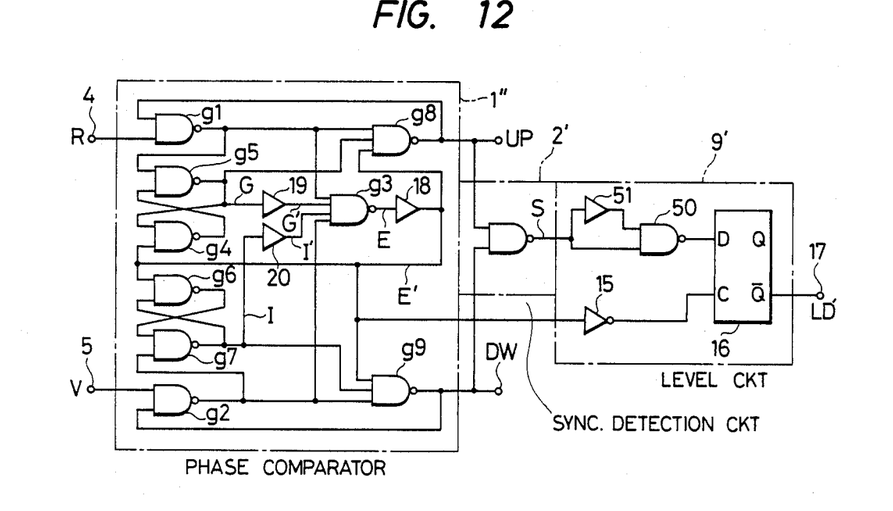

Still another embodiment of the present invention will be described with reference to FIG. 12. In comparison with the embodiment shown in FIG. 10, delay elements 18, 19, 20 are additionally inserted into the phase comparator 1" in this embodiment as shown in the drawing, and the rest of portions have the same construction. Assuming that the delay time of the delay element 15 is $T_3$, the fall of the delay signal E' of the signal E delays by the time $T_3$ so that the hatching portions of the signals B and D in FIG. 11 expand by the time $T_3$. In other words, when the signals R and V are coincident, the residual pulse width of the signals B and D expands by $T_3$ when compared with the embodiment shown in FIG. 10. Therefore, the output signal pulse width of the gate 50 expands and the selection range of the delay time $T_2$ of the delay inverter 13 expands.

Next, the operation of the delay elements 19, 20 will be explained. In order for the flip-flop 16 to operate normally, the pulse width of the C terminal input signal must be greater than the minimum width inherent to the circuit. If the minimum width cannot be secured in the embodiment shown in FIG. 10, the signals G and I are delayed by inserting delay elements 19, 20 having delay time $T_4$, $T_5$ (normally, $T_4=T_5\equiv T_6$), respectively, as in the embodiment shown in FIG. 12 so as to delay the fall point of the signal E in FIG. 11 by the time $T_6$, and a signal having a greater pulse width by the time $T_6$ can thus be supplied to the C terminal of the flip-flop 16. In this embodiment, eq. (1)' is modified to the following equation (3)':

$$T_p = |T_\theta| + \tau + T_3 - T_1 \quad (3)'$$

Figure 13:
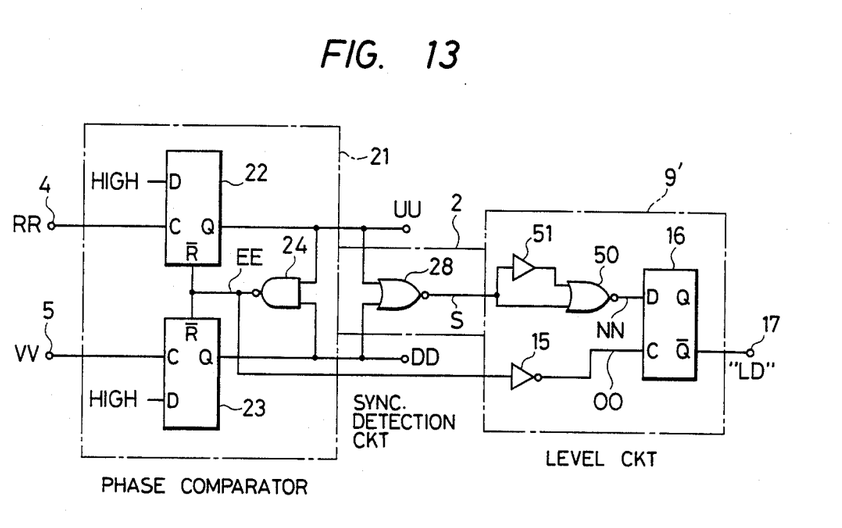

FIG. 13 shows a case where the phase comparator 21 is used in place of the phase comparator 10 in the embodiment shown in FIG. 10. Since the operation of the phase comparator 21 is the same as that of FIG. 6, its description will be omitted. The coincidence signal detector 2 consists of a gate 28 for calculating the NOR logic between the signals UU and DD, and its output is supplied to the levelizing circuit 9'. This levelizing circuit 9' is the same as the levelizing circuit 9 of the embodiment shown in FIG. 10 except that the NAND gate 50 of the levelizing circuit 9 is replaced by an NOR gate 50.

Figure 14:
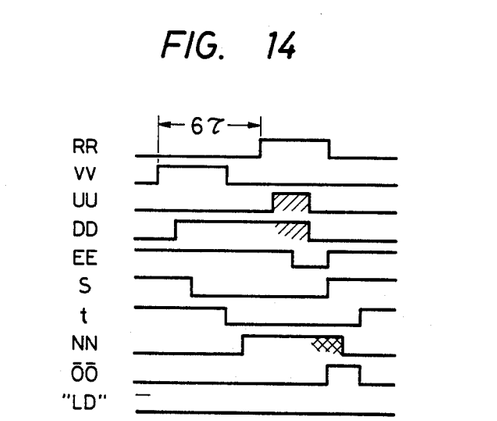

The principle of operation of FIG. 13 will be described with reference to the operating waveforms shown in FIG. 14. The output signals of the circuit elements 51, 50, 15, 24 and 28 will be assumed to be t, NN, OO, EE and S, respectively. It will be assumed also for the sake of description that the delay time till the change of the Q terminal outputs after the change of the C and $\overline{R}$ terminal signals of the flip-flops 22, 23 and the delay time of the gates 50, 51 are all $\tau$, and that the delay time $T_1$ of the delay element 51 and the delay time $T_2$ of the delay inverter 15 are all 2 $\tau$. FIG. 14 shows the case where the rising edge of the signal VV advances by 6$\tau$ with respect to the rising edge of the signal RR.

When the signals RR and VV change to the low level to the high level, the signals UU and DD rise from the low level to the high level. When both the signals UU and DD rise to the high level, the signal EE changes to the low level and the flip-flops 22, 23 are reset so that the signals UU and DD return to the low level. The hatching portions of the signals UU and DD (width: 2 $\tau$) in FIG. 14 represents the residual pulse portions that remain even when the rising edge phase between the signals RR and VV are coincident. The operation principle which provides sequentially the signals S, t, NN from the signals UU, DD is the same as that of the embodiment shown in FIG. 10. The hatching portions of the signals UU, DD moves to the double hatching portion of the signal NN after the delay 2 $\tau$. The delay inverter 15 delays the signal EE so that the rise of the signal $\overline{OO}$ is positioned near the trailing edge of the double hatching portion. If the rise phase difference between the signals RR and VV is $T_\theta$, the positive pulse width $T_p$ of the signal NN is given by the following equation (4):

$$T_p = |T_\theta| + 2\tau - T_1 \quad (4)'$$

The levelizing coincidence signal LO'' is at the low when $|T_\theta| > T_1 - 2\tau$ and at the high level when $|T_\theta| \leq T_1 - 2\tau$.

If the delay time of the gate 24 or the delay time from the $\overline{R}$ terminals of the flip-flops 22, 23 to the Q terminals is increased, the residual pulse portions in the signals UU, VV become greater in the embodiment shown in FIG. 13, and the negative pulse width of the signal Ee becomes great, too. As a result, the same effect of the delay elements 18, 19, 20 in the embodiment shown in FIG. 12 can be expected.

In the embodiments described above, the phase time difference between the signal inputted to the D terminal of the D type flip-flop 16 as the sampling circuit and the one of the two signals which are inputted to the phase comparator and whose phase delays to that of the other is inherent in each of the embodiments. Therefore, the signal obtained by delaying the slower input signal can be utilized as the sampling signal to be inputted to the C terminal of the flip-flop 16.

When a phase-locked loop is constituted by use of the phase comparator of the same type as the phase comparator shown in FIGS. 1, 6, 10, 13, the phases of the two signals inputted to the phase comparator in the loop become substantially coincident when the loop is in a locked state. The residual phase error $T_s$ as the phase difference of both signals at this time is a certain constant value determined by the transmission characteristics of the phase-locked loop, the leakage currernt of the circuit elements, and the like. In the embodiments shown in FIGS. 1, 5, 6, 8, 10, 12 and 13 if the signals inputted to the terminals 4 and 5 are the same signals as the signals are inputted to the phase comparator in the loop, and the delay time $T_1$ of the delay elements 10 and 11 (in FIGS. 1, 5 and 6), or 41 and 43 (in FIG. 8), or 51 (in FIGS. 10, 12, 13) is set so as to satisfy one of the following rerational formulas (5) (which corresponds to eq. (1) or (1)'), (6) (which corresponds to eq. (3) or (3)'), and (7) (which corresponds to eq. (4) or (4)'), the coincidence signal LD or LD' is always at the constant high or low level when the phase-locked loop is in a locked atate. When the loop is out of phase, the phase difference of the signals inputted to the phase comparator changes at random so that the coincidence signal does not have a constant level but becomes pulsive, but in comparison with the case where the present invention is not applied, the occurence of the level opposite to the level in a locked state becomes predominnant.

$$T_1 > |T_s| + \tau \quad (5)$$

$$T_1 > |T_s| + \tau + T_3 \quad (6)$$

$$T_1 > |T_s| + 2\tau \quad (7)$$

In accordance with the present invention, the phase coincidence signal can be levelized. Therefore, it is possible to discriminate at any instant whether the two signals inputted to the phase coincidence detector are in phase or out of phase. If the phase coincidence detector in accordance with the present invention is applied to the phase-locked loop, the setting range of the time constants of the phase coincidence signal integration circuit can be expanded, so that the integration circuit can be simplified and whether or not the phase-locked loop is in a locked state can be monitored stably. Since the embodiments shown in FIGS. 1, 6, 10 and 13 by the present invention does not change at all the characteristics of the phase comparator main body, it can be used as such in the phase-locked loop.

What is claimed is:

1. A phase coincidence detector comprising:
   a phase comparator for comparing the phase of a first input digital signal with that of a second input digital signal and outputting a first delay signal representing the delay of one of said input signals to the other and a first advance signal representing the advance of one of said input signals to the other;
   a first circuit for making zero the output pulse width of said delay signal and said advance signal when the phase difference between said first and second input digital signals is below a predetermined value; and
   a sampling circuit for sampling the comparison output of said delay signal and said advance signal through said first circuit and outputting a coincidence detection signal.

2. A phase coincidence detector according to claim 1, wherein said first circuit comprises:
   a pulse width discrimination circuit for cutting off the leading part of the pulses of said first delay signal and said first advance signal to reduce their pulse width and providing a second delay signal and a second advance signal;
   a first logic circuit for calculating the logical sum between said second delay signal and said second advance signal; and
   a delay element for delaying a signal inside said phase comparator having substantially the same phase as that of residual pulses existing in said first delay signal and said first advance signal even when the phase difference between said first input digital signal and said second input digital signal is zero;
   said sampling circuit sampling the output signal of said first logic circuit by the output signal of said delay element.

3. A phase coincidence detector according to claim 1, wherein said first circuit comprises:
   a pulse width discrimination circuit for cutting off the leading part of the pulses of said first delay signal and said first advance signal to reduce their pulse width and providing a second delay signal and a second advance signal;
   a first logic circuit for calculating the logical product between said second delay signal and said second advance signal; and
   a delay element for delaying a signal inside said phase comparator having substantially the same phase as that of residual pulses existing in said first delay signal and said first advance signal even when the phase difference between said first input digital signal and said second input digital signal is zero;
   said sampling circuit sampling the output of said first logic circuit by the output signal of said delay element.

4. A phase coincidence detector comprising:
   a phase comparator for comparing the phase of a first input digital signal with that of a second input digital signal and outputting a first delay signal representing the delay of one of said input signals to the other and a first advance signal representing the advance of one of said input signals to the other;
   a first logic circuit for calculating the logical product between said delay signal and said advance signal;
   a pulse width discrimination circuit for discriminating the pulse width of the logical product signal from the output of said first circuit, and cutting of the leading part of said pulse to reduce the pulse width; and
   a sampling cirucit for sampling the output of said pulse discrimination circuit and outputting a phase coincidence detection signal.

5. A phase coincidence detector according to claim 4, wherein said pulse width discrimination circuit comprises a first delay element for delaying said logical product signal and a second logical product circuit for calculating the logical product between the input and output of said first delay element, and said sampling circuit includes a delay element for delaying a signal inside said phase comparator having substantially the same phases as residual pulses existing in said delay signal and said advance signal when the phase difference between said first and second input digital signals is zero, and samples the output of said second logical product circuit by the output signal of siad delay element.

6. A phase coincidence detector comprising:
   a phase comparator for comparing the phase of a first input digital signal with that of a second input digital signal and outputting a first delay signal representing the delay of one of said input signals to the other and a first advance signal representing the advance of one of said input signals to the other;
   a first circuit for calculating the logical sum signal between said delay signal and said advance signal;
   a pulse width discrimination circuit for discriminating the pulse width of the logical sum signal as the output of said first circuit and cutting off the leading part of said pulse to reduce the pulse width; and
   a sampling circuit for sampling the output of said pulse discrimination circuit and outputting a phase coincidence detection signal.

* * * * *